(12) United States Patent
Beckers

(10) Patent No.: US 7,714,335 B2
(45) Date of Patent: May 11, 2010

(54) LIGHT-EMITTING DEVICE WITH INORGANIC HOUSING

(75) Inventor: Lucas Johannes Anna Maria Beckers, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 369 days.

(21) Appl. No.: 11/719,303

(22) PCT Filed: Nov. 15, 2005

(86) PCT No.: PCT/IB2005/053752

§ 371 (c)(1), (2), (4) Date: May 15, 2007

(87) PCT Pub. No.: WO2006/054233

PCT Pub. Date: May 26, 2006

(65) Prior Publication Data

US 2009/0166651 A1  Jul. 2, 2009

(30) Foreign Application Priority Data

Nov. 19, 2004  (EP) .................................. 04105918

(51) Int. Cl.
*H01L 33/48* (2010.01)
(52) U.S. Cl. ................... 257/88; 257/98; 257/E33.058; 257/E33.061; 257/E21.5; 438/28; 438/29
(58) Field of Classification Search ............ 257/88–90, 257/98–100, E33.055–E33.061, E21.5; 438/26, 438/28, 29, 34, 35
See application file for complete search history.

(56) References Cited

U.S. PATENT DOCUMENTS

| 4,040,078 | A  | * | 8/1977 | Eckton et al. ............... 250/551 |
| 6,353,250 | B1 | * | 3/2002 | Fukano ...................... 257/432 |
| 2004/0027062 | A1 |   | 2/2004 | Shiang et al. |
| 2004/0173808 | A1 | * | 9/2004 | Wu ............................. 257/99 |
| 2004/0223315 | A1 | * | 11/2004 | Suehiro et al. ................ 362/84 |
| 2005/0051859 | A1 | * | 3/2005 | Hoffman .................... 257/434 |

FOREIGN PATENT DOCUMENTS

JP    2003179270 A    6/2003

* cited by examiner

*Primary Examiner*—Minh-Loan T Tran
*Assistant Examiner*—W. Wendy Kuo
(74) *Attorney, Agent, or Firm*—Mark L. Beloborodov

(57) ABSTRACT

The present invention relates to a light-emitting device comprising at least one light-emitting diode, which emits light, and a housing arranged to receive at least a portion of said light. The housing comprises a translucent inorganic material and is provided with at least one recess, which comprises positioning and orientating means. The at least one light-emitting diode is arranged in the at least one recess and is positioned and orientated by said positioning and orientating means, and a translucent inorganic contact layer material is arranged between the at least one light-emitting diode and the housing in the at least one recess to receive at least portion of the light and to connect said light-emitting diode to said housing.

11 Claims, 2 Drawing Sheets

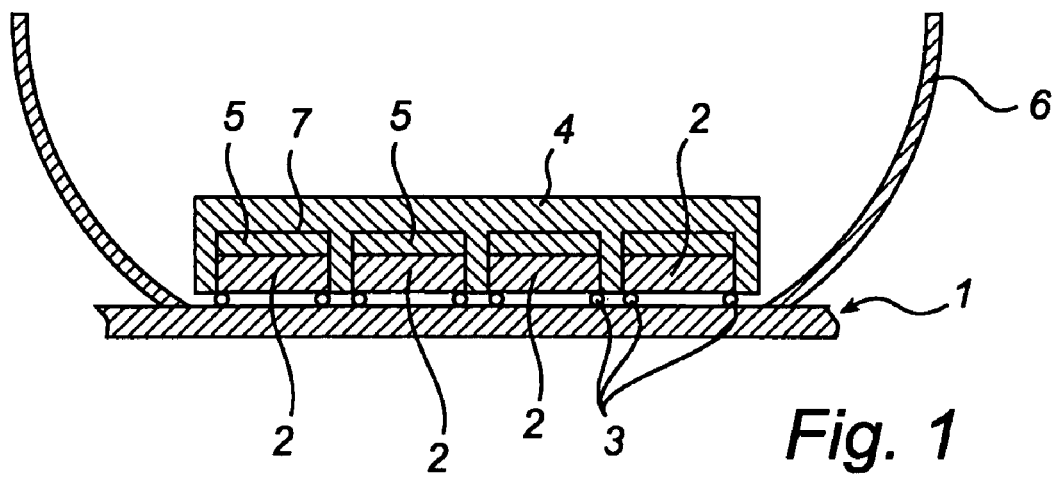
Fig. 1
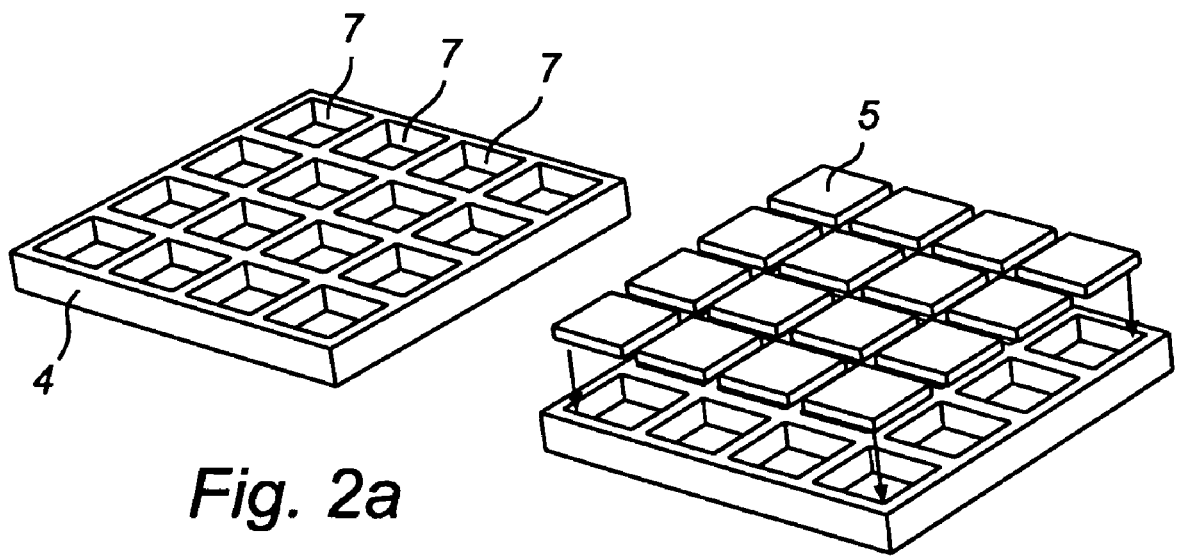
Fig. 2a
Fig. 2b

LIGHT-EMITTING DEVICE WITH INORGANIC HOUSING

TECHNICAL FIELD

The present invention relates to a light-emitting device comprising a light-emitting diode, which emits light, and a housing arranged to receive at least a portion of said light. The invention also relates to methods for the manufacture of such light-emitting devices.

TECHNICAL BACKGROUND

Semiconductor light-emitting devices, such as light-emitting diodes (LEDs) and laser diodes (LDs), are among the most efficient and robust light sources currently available.

Light extraction is a key issue for light emitting devices. A common problem with semiconductor light-emitting devices is that the efficiency with which light may be extracted from the device is reduced due to internal reflection in the interface between the device and the surroundings, followed by reabsorption of the reflected light in the device. The internal reflection is due to that the refractive index of the device materials is higher than the refractive index of the material in which the device is packaged or encapsulated.

For high efficient light extraction, it is advantageous if the light extracting materials are in direct contact with the light-emitting device. However, in high power applications, where single solid-state light emitting devices with an effect of up to 3 Watts per square mm or arrays of such devices, with a total effect of up to 100 Watts or more, a lot of heat is dissipated from the light emitting devices. Temperatures of up to 250° C. are easily reached for such high power application.

Thus, for high-power applications, a heat resistant encapsulation has to be used. Thus it would be advantageous to use a fully inorganic approach, as inorganic materials may be chosen that have very high temperature resistance.

JP-2003179270-A describes a semiconductor light emitting element coated directly with a translucent coating material made of polymetaloxane or ceramic and that is heat resistant.

However, the processing temperature for connecting the coating material and the light emitting element must be low, e.g. lower than 340° C., or otherwise, the n/p-junctions in the light emitting element will be damaged.

For coatings/encapsulations of ceramic materials, it would be advantageous to be able to use higher temperatures, for example to increase the range of different materials which can be used, and in steps of attaching other components, such as for example lenses, to the encapsulation.

However, substrates and circuitry on which light-emitting semiconductor devices are arranged are often heat sensitive. Thus, it would be advantageous with a device that allows for high-temperature processing of the encapsulation without damaging the substrate and/or circuitry.

For high-intensity applications, it would also be advantageous to be able to easily arrange several semiconductor light-emitting devices under one and the same encapsulation to, for example, reduce the size of the device and to improve color mixing.

SUMMARY OF THE INVENTION

One object of the present invention is thus to provide a light-emitting device which overcomes the above-mentioned problems of the prior art. Another object is to provide a method for the manufacture of such a light-emitting device.

Thus, in a first aspect the present invention relates to a light-emitting device comprising at least one light-emitting diode, which emits light, and a housing arranged to receive at least a portion of said light.

The housing comprises a translucent inorganic material and is provided with at least one recess, which comprises positioning and orientating means.

The at least one light-emitting diode is arranged in the at least one recess and is positioned and orientated by said positioning and orientating means, and a translucent inorganic contact layer material is arranged between the at least one light-emitting diode and the housing in the at least one recess to receive at least portion of the light and to connect said light-emitting diode to said housing.

The use of an inorganic housing material and an inorganic contact layer allows for the device to be resistant to high temperatures well above 200° C. that may occur when the device is operated using high-power LEDs, and at which temperatures organic materials will disintegrate.

The positioning and orientating means may for example be constituted by the walls of the at least one recess.

In order to connect the at least one light-emitting diode to a power supply, the light-emitting diode in a device according to the present invention may further comprise a substrate on which a circuitry is arranged, wherein the at least one light-emitting diode is arranged on and connected to the circuitry.

The device may comprise an array of a plurality of light-emitting diodes wherein the LEDs will be arranged in a recess, each being positioned and oriented by the positioning and orientating means in separate positions. The circuitry will then be arranged on and connected to each LED at the position for each LED.

In a device of the present invention comprising an array of multiple LEDs, each LED may be arranged in a separate recess. This improves, for example, the possibilities for choosing different contact layer materials for different LEDs.

The inorganic material constituting the housing may be a ceramic material. Ceramic materials are advantageously used as the housing material as they, in addition to being heat resistant, often have essentially the same heat expansion coefficient as light-emitting diodes. Thus, essentially no tension is put on the device due to temperature changes during operation of the device.

The inorganic housing material may comprise a phosphor compound. Phosphor compounds may be used in the housing material to convert the color of the light received from the light-emitting diode into a desired converted color.

The translucent inorganic contact layer material may be a glass material.

Glass materials are preferred to use as they easily can be formed to fill a recess, such as by melting the temperature at which the glass is liquid. Further, heat expansion coefficient is essentially the same as for a ceramic material and for a light-emitting diode.

The translucent inorganic contact layer may further comprise a luminescent material.

The luminescent compound in the contact layer can be used to convert the color of light received from the light-emitting diode into light of a desired color.

In embodiments with a plurality of light-emitting diodes arranged in separate recesses in a housing, different contact layer materials, e.g. comprising different luminescent materials, may be arranged between different LEDs and the housing. Thus, light emitted through the contact layer of separate light-emitting diodes may have different color, even if light-emitting diodes with the same intrinsic color are used.

In a second aspect, the present invention also relates to a method for the manufacture of a light-emitting device. Such a method comprises providing at least one light-emitting diode and providing a housing having at least one recess, wherein the housing comprises a translucent inorganic material. Positioning and orientating means are arranged in the at least one recess, and a translucent inorganic contact layer material is arranged in the recess. Then, at least one light-emitting diode is arranged on said contact layer material in said recess, such that the at least one light emitting diode is positioned and orientated by the orientating and positioning means and the contact layer and said housing receives at least part of light emitted by said light-emitting diode.

One advantage with the method is that the contact layer can be arranged in the recess at high temperature, preferably at a temperature where the contact layer material is in a liquid state to easily spread in the recess, and to allow a good contact between the contact layer and the housing. Then, the light-emitting diode may also be arranged in the recess and connected to the contact layer at a high temperature to allow good contacting between the contact layer and the light-emitting diode.

The method of the present invention may further comprise the light-emitting diode to a circuitry, which preferably may be performed after the light-emitting diode is arranged in the housing. This step can be performed at a temperature that is not detrimental to the circuitry, or components associated therewith, such as a substrate on which the circuitry is arranged.

BRIEF DESCRIPTION OF THE DRAWINGS

FIG. 1 illustrates, in cross-sectional view, a light-emitting device of the present invention.

DETAILED DESCRIPTION OF PREFERRED EMBODIMENTS

Figure 2C:
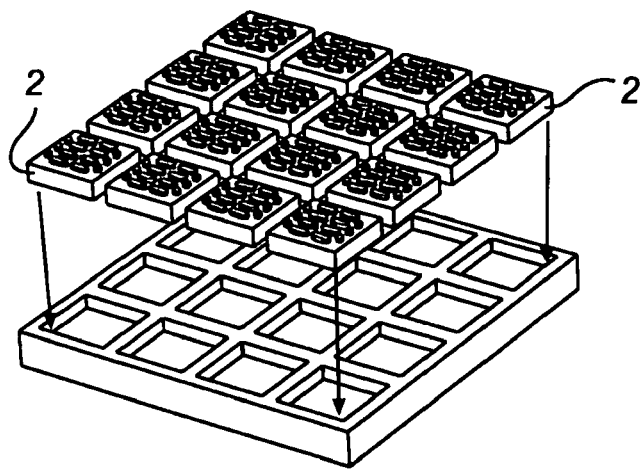
FIG. 2, a-f, outlines a method for the manufacture of a light-emitting device of the present invention.

The present invention will now be described more in detail with reference to the drawings.

A preferred embodiment of the present invention, as shown in FIG. 1, comprises a substrate 1 provided with a circuitry. An array of light-emitting diodes (LEDs) 2 are arranged on the circuitry, and each LED of the array are separately connected to the circuitry by metal bumps 3 at pre-determined positions.

The LEDs 2 are arranged in separate recesses in a housing 4 of a translucent inorganic material, and the location and the orientation of each LED is determined by the walls of the recess. A translucent inorganic contact layer 5 is arranged between each LED and the housing 4, in the recesses to optically connect and physically bind the LED to the housing.

Furthermore, a specular reflector 6 is arranged on the substrate 1 to collimate the light emitted by the device.

A preferred method for the manufacture of a light-emitting device of the present invention is outlined in FIG. 2, a-f.

An inorganic translucent housing 4 having a plurality of recesses 7 is provided. (FIG. 2a)

A translucent inorganic contact layer material 5 is arranged in each of the recesses 7, preferably at a temperature at which the contact layer material is liquid, above the softening temperature for the contact layer material, for example in the range from 300° C. to 1600° C., depending on the contact layer material, as this improves the contact to the housing (FIG. 2b).

Figure 2D:
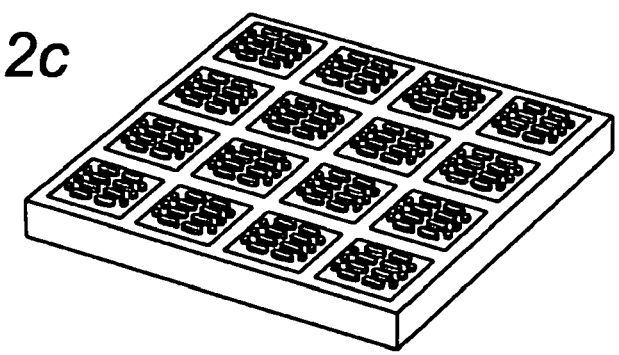

Then, a LED 2 is arranged in each recess 7 provided with contact layer material 5, at a temperature between the glass temperature and the softening temperature of the contact layer material for example in the range from 250° C. to 400° C., preferably lower than 350° C. (depending on the contact layer material), to obtain good contact between contact layer material and LED. The thus formed housing-LED assembly is cooled down to a temperature where bonding of the LED to the housing via the contact layer is obtained (FIG. 2c-d).

Figure 2E:
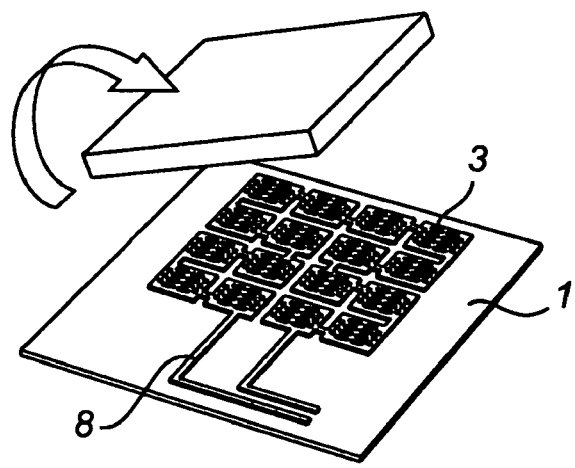
Figure 2F:
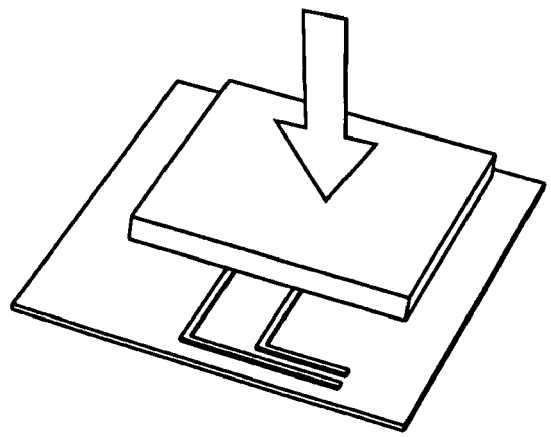

The housing-LED assembly is then arranged on a substrate 1 to bring the connectors of the LEDs in contact with metal bumps 3 arranged on a circuitry 8 arranged on the substrate (FIG. 2e). The housing-LED assembly and the substrate are thermo-compressed at a temperature high enough to effect binding of the LEDs to the circuitry, but still at a temperature low enough that the substrate and circuitry on the substrate are not damaged (FIG. 2f).

The described method allows for the formation of the LED-housing assembly in a process involving temperatures at which the circuitry and the substrate would be damaged. This allows for the use of inorganic materials to be used as housing and contact layer materials.

It is to be understood that the above-mentioned preferred embodiments are provided for illustrative purposes only, and the invention is only limited to the scope of the appended claims. Those skilled in the art will realize that variations of the present invention is possible, which still falls under the scope of the claims.

The substrate may be any substrate suitable on which a circuitry may be arranged. Commonly used substrates are well known in the art and include, for example, silicon substrates and aluminum nitride substrates.

The circuitry comprises a pattern of an electrically conducting material, such as metallic or non-metallic electrically conducting compounds. In FIG. 2, the circuitry is arranged to connect all LEDs in series. However, other circuitry configurations are possible, such as parallel connection or separate connection of each LED.

Metal bumps may be used to connect the LEDs to the circuitry, and comprises an electrically conducting material, such as a metal, for example gold or tin. They are arranged on the circuitry in a pattern, which corresponds to the positioning of the LEDs in the housing. Thus, after the LEDs are arranged in the housing, the location of the contact pads of the LEDs fits on the pattern of the metal bumps.

Light-emitting diodes suitable for use with the present invention include LEDs capable of emitting light in the range from ultra-violet to infrared light.

As used herein the term "light-emitting diodes" refers to diodes emitting light in any wavelength interval from UV-light to infrared light, and is also taken to include laser diodes.

Examples of LEDs suitable for use in the present invention include those constructed by growing n/p light-emitting layers on sapphire (single crystal alumina) substrates, to obtain a LED having a flat profile with the connectors to both the cathode and the anode of the diode located on the lower side LED, i.e. no wire bonding is located on the upper side of the LED, i.e. the side of the LED mainly emitting light ("flip-chip"-LEDs). Such LEDs are mounted in the housing with the upper side facing the housing, such that the connectors are easily accessible.

In preferred embodiments of the present invention, the LEDs are blue or UV emitting diodes, as blue/UV light easily can be converted into light of other colors by luminescent compounds.

High-power LEDs, with an effect of 3 Watts per square mm or more, may advantageously be used in the present invention.

The contact layer functions as a layer that optically connects and physically binds a LED to the housing. Moreover, the contact layer acts as a light-extracting layer, extracting the light out of the light-emitting diode.

The contact layer material may be a translucent, especially transparent, glass material, for example chosen from the group comprising chalcogenide glass, lead silicate glass, tellurate glass, bismuth glass, etc.

As used herein, the term "translucent" is taken to also include "transparent", in the meaning that a transparent material is a translucent material. A glass material is advantageously due to the good optical properties of glass and that they, at a temperature above the softening point for the material, at which the glass material is liquid, but below the melting point for the housing material, easily can be arranged in a recess in the housing, either by dispensing the liquid glass material in the recesses or by melting disposed glass in the recesses.

Other contact layer materials suitable for use in the present invention include aluminum phosphate and aluminum oxide, as well as mixtures thereof.

Preferably, the contact layer material has a refractive index in the range from at least 1.7 up to 2.3, or even higher.

The thickness of the contact layer can vary in the range of from less than 2 µm to higher than 150 µm. The contact layer material can further contain luminescent compounds to convert the color of light emitted by the LED into a desired color, for example for converting blue light into green or red light, or for converting UV-light into blue, green or red light. Such luminescent compounds suitable for incorporation into the contact layer material are known to those skilled in the art. Examples include, but are not limited to luminescent silicon nitride compounds, such as $Sr_2Si_5N_8$ doped with europium, aluminum or oxygen.

As used herein, the term "luminescent material" comprises both fluorescent and phosphorescent materials, which absorbs light of a wavelength or wavelength interval and emits light of another wavelength or wavelength interval.

In embodiments of the present invention comprising several LEDs arranged in separate recesses, different contact materials, e.g. comprising different luminescent materials, may be arranged in different recesses. Thus, an array of LEDs of the same type, for example UV emitting diodes may be arranged in the housing, where the light emitted from different LEDs are converted into different colors by different luminescent materials in the contact layer, for example into blue, green and red light respectively to provide a RGB-array. Such an array can be used to provide white light, or, when separate LEDs can be driven independently, to provide a color variable light-emitting device. Alternatively, to form a RGB-array, an array of blue and green LEDs may be arranged in a housing, wherein the light from some of the blue or green LEDs may be converted by a blue-to-red or green-to-red luminescent material, respectively, in the contacting layer for some of the LEDs.

The housing of the present invention is made of an inorganic translucent material. The material may for example be a ceramic material including, but limited to materials selected from the group consisting of polycrystalline alumina ($Al_2O_3$), yttrium-aluminum-garnet (YAG, $Y_3Al_5O_{12}$), yttria ($Y_2O_3$), ($MgAl_2O_4$), MgAlON, aluminum nitride (AlN), AlON, SiON, SiAlON, and titania ($TiO_2$) doped zirconia ($ZrO_2$) and mixtures thereof. Other materials suitable for use with the present invention include for example ceramic glass composites, for example AlMgSi-oxide, and glass materials having a thermal expansion coefficient near that of sapphire, and having a melting point higher than the softening point of the contact layer material.

Ceramic materials suitable for use in the present invention is highly heat resistant and can stand the high temperatures dissipated by high-power LEDs and used when the contact layer material is filled into the recesses. Preferably the housing material is resistant to even higher temperatures, such as the temperatures used in optional steps of connecting the housing to a ceramic or glassy light extracting body.

The housing of the present invention has several functions. One function is to arrange the LEDs in desired positions and orientations before the LED-housing assembly is arranged on the substrate and the LEDs are connected to the circuitry.

Preferably, the recess in the housing is sized such that a LED easily fits in the recess, but becomes arranged in a desired location and direction to also be properly connected to the circuitry. This is especially advantageous when an array of LEDs is arranged in individual recesses in a housing. All the LEDs becomes properly located and aligned in the housing to fit on a pre-produced circuitry.

In the embodiment shown in FIGS. 1 and 2, each LED is arranged in a separate recess, and the walls of the recesses constitutes the positioning and orientating means for each LED. However in other embodiments of the present invention, more than one LED may be arranged in a recess, and in such cases, the positioning and orientating means may, for example, be constituted by elements which prevents LEDs from moving or rotating in the plane of the LEDs, but which means does not form walls separating the recess into a plurality of recesses.

Another, optional, function of the housing is to convert the color of the light received by the housing into a desired color. In such instances, the housing material comprises a luminescent compound, or combinations of two or more luminescent compounds. Such luminescent compound(s) may preferably be selected from yttrium-aluminum-garnet doped with cerium, praseodymium, europium or combinations thereof, for example (YAG:Ce), (YAG:Ce,Pr), and (YAG:Ce,Eu).

Different combinations of materials for the contact layer and the housing are possible, as will be realized by those skilled in the art.

For example, an array of LEDs can be provided with contact materials comprising luminescent materials to provide for example an RGB-array, which can provide white or color variable light. In such a case, the housing does not need to comprise any phosphor material to further convert the color of the light.

In another example, an array of blue LEDs may be used with a contact layer not comprising any luminescent material, and a housing comprising for example YAG:Ce to convert the blue light into white light. In the latter case however, some of the blue LEDs can optionally be substituted for green LEDs, and/or the contact material of some blue LEDs may optionally be provided with a blue-to-red-converting luminescent material to change the color temperature of the produced light.

Furthermore, other optical components may be used in combination with the device of the present invention. For example, collimating, focusing or dispersing lenses may be arranged on the housing to alter the direction of the light emitted by the LEDs. A specular reflector arranged on the substrate around the housing to collimate/focus the emitted light, as shown in FIG. 1 may also be used.

The invention claimed is:

1. A light-emitting device comprising:
   a first light-emitting diode positioned in a first location and orientated in a first orientation and a second light-emitting diode positioned in a second position and orientated in a second orientation;
   a housing arranged to receive at least a first portion of light emitted by said first and the second light-emitting diodes, wherein said housing comprises a translucent inorganic material defines at least one recess configured for positioning and orientating said first and second light-emitting diodes,
   a first contact layer comprising a first material and disposed between said first light-emitting diode and said housing, and
   a second contact layer comprising a second material is disposed between said second light-emitting diode and said housing, the first and second layers receiving at least a second portion of said light and connecting said first and second light-emitting diodes, respectively, to said housing, at least one of said first and second materials comprising a luminescent material.

2. A light-emitting device according to claim 1, wherein said at least one recess comprises one or more surfaces for positioning and orientating said first and second light-emitting diodes.

3. A light-emitting device according to claim 1, further comprising a substrate supporting a circuitry thereon, wherein said circuitry is arranged on and connected to said first light-emitting diode at said first location and arranged on and connected to said second light-emitting diode at said second location.

4. A light-emitting device according to claim 1, wherein said housing defines a first recess and a second recess, wherein sad first light emitting diode is arranged in said first recess and said second light emitting diode is arranged in said second recess.

5. A light-emitting device according to claim 1, wherein said translucent inorganic material comprises a ceramic material selected from the group consisting of: polycrystalline alumina ($Al_2O_3$), yttrium-aluminum-garnet (YAG, $Y_3Al_5O_{12}$), yttria ($Y_2O_3$), ($MgAl_2O_4$), MgAlON, AlaN, AlMgSi-oxide, SiON, SiAlON and titania ($TiO_2$) doped zirconia ($ZrO_2$) and mixtures thereof.

6. A light-emitting device according to claim 1, wherein said translucent inorganic material comprises a phosphor compound comprising yttrium-aluminum-garnet (YAG) doped with an element selected from the group consisting of: cerium, praseodymium, europium and combinations thereof.

7. A light-emitting device according to claim 1, wherein said contact layer material comprises a glass material selected from the group consisting of: chalcogenide glass, lead silicate, tellurate glass, bismuth glass and combinations thereof.

8. A method for the manufacture of a light-emitting device, comprising:
   providing at least one light-emitting diode;
   providing a housing having at least one recess, said housing comprising a translucent inorganic material;
   arranging positioning and orientating means in said at least one recess;
   arranging a translucent inorganic contact layer material in said recess; and
   arranging said at least one light-emitting diode on said contact layer material in said recess at a temperature between 250° C. and 400° C., such that said light emitting diode is positioned and orientated by said orientating and positioning means, and said contact layer and said housing receives at least a portion of light emitted by said light-emitting diode.

9. A method according to claim 8, further comprising connecting said at least one light-emitting diode to a circuitry.

10. A method according to claim 8, wherein said contact material is arranged in said recess at temperature above the softening temperature for said contact material.

11. A method according to claim 10, wherein said temperature above the softening temperature for said contact material is in the range of from 300° C. to 1600° C.

* * * * *